United States Patent [19]

Norioka

[11] 4,393,309

[45] Jul. 12, 1983

[54] METHOD AND APPARATUS FOR CONTROLLING THE OBJECTIVE LENS IN A SCANNING ELECTRON MICROSCOPE OR THE LIKE

[75] Inventor: Setsuo Norioka, Akishimashi, Japan

[73] Assignee: JEOL Ltd., Tokyo, Japan

[21] Appl. No.: 299,009

[22] Filed: Sep. 3, 1981

[30] Foreign Application Priority Data

Sep. 12, 1980 [JP] Japan .................................. 55-126812

[51] Int. Cl.³ .......................... G21K 1/08; G21K 5/10; H01J 3/14
[52] U.S. Cl. ......................... 250/396 R; 250/396 ML; 250/310; 250/311
[58] Field of Search ..................... 250/310, 311, 442.1, 250/440.1, 396 R, 396 ML, 453.1; 219/121 EP, 121 E, 121 EY

[56] References Cited

U.S. PATENT DOCUMENTS 3,715,582  2/1973  Akahori et al. ................. 250/311 X
3,842,236  10/1974  Von Walter ................. 219/121 EY

FOREIGN PATENT DOCUMENTS 55-110044  8/1980  Japan .............................. 250/396 R Primary Examiner—Alfred E. Smith
Assistant Examiner—Jack I. Berman
Attorney, Agent, or Firm—Webb, Burden, Robinson & Webb

[57] ABSTRACT

The relation between the focusing distance (D) of the objective lens and the excitation current (I) of the objective lens is stored in a data memory. The initial focusing distance ($D_o$) corresponding to the optimum excitation current is determined as a result of the focusing adjustment operation. Thereafter, the change ($\Delta D$) in the focusing distance due to the specimen shift along the optical axis of the objective lens is detected. The magnitude of the excitation current corresponding to the focusing distance ($D_o + \alpha D$) is read from said memory and a current of that magnitude is supplied to the objective lens.

2 Claims, 3 Drawing Figures

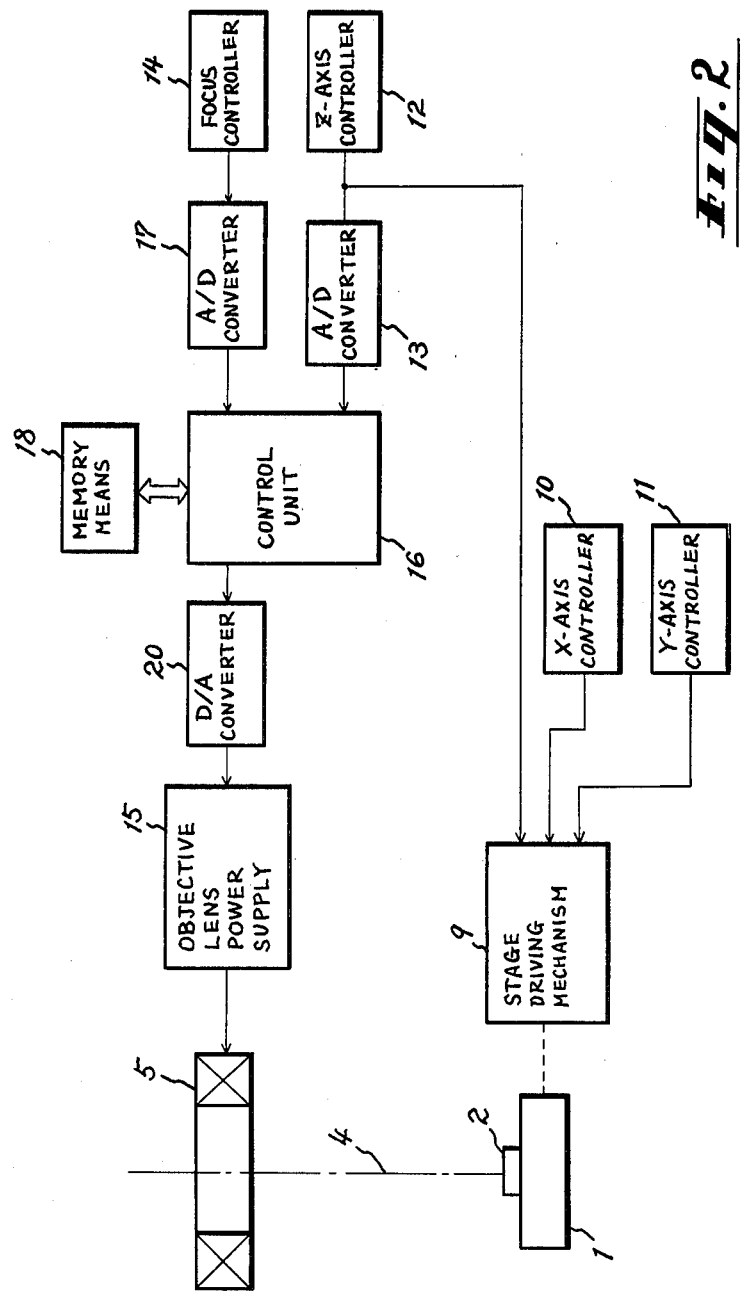

METHOD AND APPARATUS FOR CONTROLLING THE OBJECTIVE LENS IN A SCANNING ELECTRON MICROSCOPE OR THE LIKE

BACKGROUND

This invention relates to a method and apparatus for controlling the current supplied to an objective lens in a scanning electron microscope (SEM), or some other similar charged particle beam scanning device.

As shown in FIG. 1, a SEM or some other similar device incorporates a specimen stage 1 supporting a specimen holder 2 in which a specimen 3 is placed. The specimen 3 is irradiated by an electron beam 8 which is focused by the objective lens (final stage condenser lens) 5 energized by an objective lens power supply 7. The output current of the objective lens power supply 7 is adjusted in a focusing operation so that the electron beam 8 is focused on the specimen surface S by the objective lens 5. For various purposes, the specimen stage 1 is shifted vertically along the optical axis 4 of the objective lens 5 by means of a stage driving means 6. Heretofore, the change in vertical position of the specimen stage 1 after said focusing operation was detected by the stage driving means 6 to produce a corresponding displacement signal. The displacement signal was supplied to the objective lens power supply 7 so that a correcting excitation current component could be supplied to the objective lens 5. The correcting current component shifted the focusing plane of the electron beam 8 automatically.

The specimen surface plane S is usually different from the reference plane S' flush with the upper surface of the holder 2 as indicated by broken line in FIG. 1, particularly in the case that the specimen has large protrusions and dents. Further, the relation between the excitation current (I) of the objective lens and the focusing distance (D) (between the electron beam focusing plane and the principal plane of the objective lens) normally is not linear. Accordingly, the precise correcting excitation current value for compensating the defocus due to the specimen shift by the objective lens is not obtained simply by the information of the vertical positioning signal (corresponding to the said reference plane S') of the specimen stage 1. And it is apparent from the above reasons that the above said conventional method for automatically correcting the focus condition is extremely inaccurate. Therefore, each time the specimen stage is vertically shifted, it is necessary to readjust an excitation current of the objective lens to precisely focus the electron beam on the specimen surface, a procedure which is quite troublesome.

An object of the present invention is to provide a method and apparatus for automatically and precisely correcting the focus condition without regard to the vertical shift of a specimen, and thereby enhance the operability of the SEM or the like.

SUMMARY OF THE INVENTION

Briefly, according to this invention, a charged particle beam scanning device is provided with a memory means for storing data which specify the relation between the excitation current (I) of the objective lens and the focusing distance (D) of the objective lens. A specimen stage driving means is provided for shifting a specimen position vertically and generates signals corresponding to the change ($\Delta D$) in the focusing distance. A control device is placed between the objective lens on the one hand and the memory means and specimen stage driving means on the other. Firstly, initial distance ($D_o$) corresponding to the optimum excitation current ($I_o$) is determined by the focusing adjustment operation and $D_o$ is memorized by said control device. Thereafter as the specimen shifts producing a $\Delta D$ signal, the said control device reads from the memory the excitation current corresponding to the focusing distance ($D_o + \Delta D$) and the objective lens is supplied with the excitation current (I) corresponding to ($D_o + \Delta D$).

BRIEF DESCRIPTION OF THE DRAWINGS

FIG. 2 is a block diagram showing one embodiment according to this invention.

DETAILED DESCRIPTION OF THE INVENTION

Figure 1:
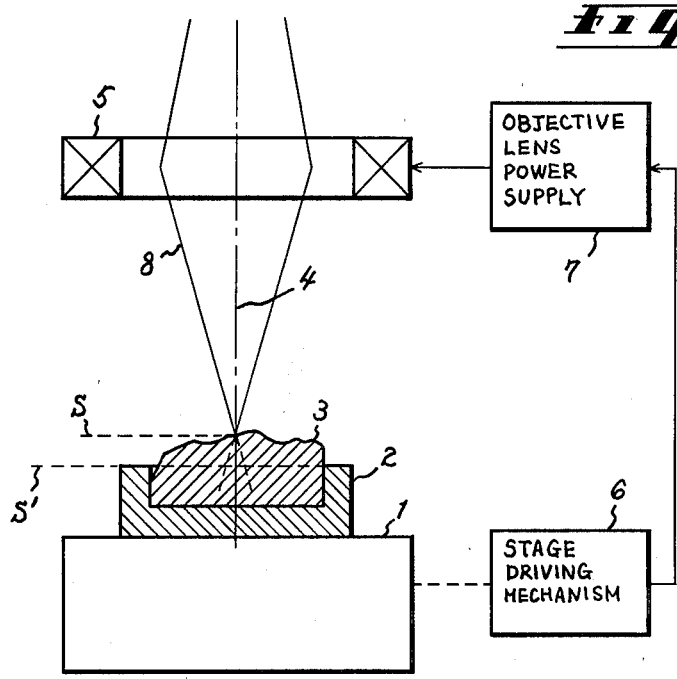
FIG. 1 is a schematic drawing showing an objective lens and a specimen stage in a conventional scanning beam device.

Referring to FIG. 2, a specimen stage 1 is moved by a stage driving mechanism 9. The details of the stage driving apparatus are well known in the art. For a description of stage driving apparatus and associated controllers reference may be had to the following U.S. Pat. Nos. 3,107,297; 3,644,700; and 3,900,737. The position of the specimen stage 1 on the XY plane perpendicular to the optical axis 4 of the objective lens 5 is controlled by an X axis controller 10 and a Y axis controller 11. The output signal of a Z axis controller 12, which includes a variable resistor and others as constituent parts, is also supplied to the stage driving mechanism 9. The stage driving mechanism comprises motors so that the Z axis (vertical) position of the specimen stage 1 is determined by the output signal of the Z axis controller. A focus controller 14 for controlling the output excitation current of the objective lens power supply 15 comprises a variable resistor and others and supplies an output digital signal to a control unit (for example, microprocessor) 16 via an A/D converter 17. The details of the focus control circuit for applying the variable excitation current are well known in the art. For a description of the suitable circuit, reference may be had to U.S. Pat. No. 3,715,582.

Figure 3:
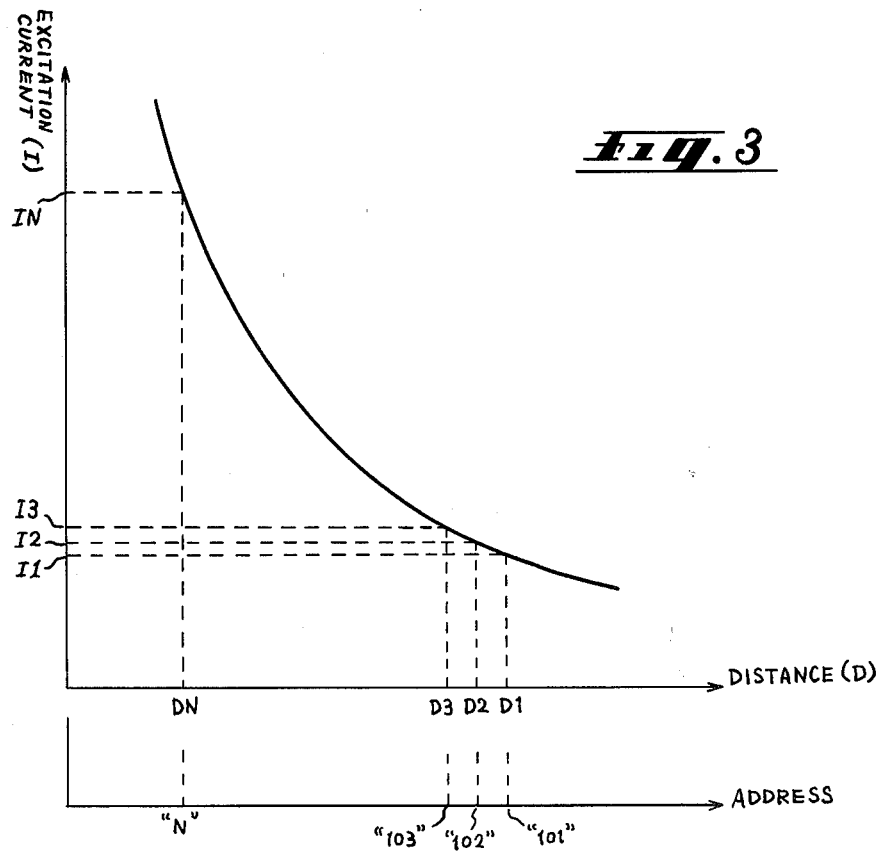
FIG. 3 is a schematic diagram for explaining the operation of the embodiment shown in FIG. 2.

A memory means (for example, Read Only Memory (ROM)) 18 stores the data as shown, for example, in FIG. 3 in which the vertical axis indicates the excitation current value (I) of the objective lens and horizontal axis indicates the distance (D) between the principle plane of the objective lens and the electron beam focusing plane of the objective lens. Addresses, say, "101" to "N" of the memory means 18 correspond to the output digital signals of the A/D converter 17 and to the locations D1, D2, D3, ... DN. Intervals between the locations are the same and very short. At the memory addresses corresponding to these locations are stored the excitation current values I1, I2, I3, ... IN, respectively.

The control unit 16 reads out the contents in the memory means 18 at an address corresponding to the digital signal (also corresponding to any one of the distance D1 through DN) from the A/D converter 17, and transfers the data of the excitation current value to a D/A converter 20. An output signal from the D/A converter 20 is supplied to the objective lens power supply 15, which supplies the objective lens coil with an excitation current corresponding to the value of the current specified by the memory.

The output signal of the Z axis controller 12 is converted to digital signal by an A/D converter 13 and then supplied to the control unit 16. A change in the digital signal from the A/D converter 13 corresponds to the change in the focusing distance (D) in the data stored in said memory means 18, and is monitored by the control unit 16.

In operation, the operator first actuates the focus controller 14 to change the digital signal supplied from the A/D converter 17 to the control unit 16. In response to the changed digital signal supplied, the control unit 16 reads out the data of a corresponding address in the memory means 18 and delivers the same to the D/A converter 20. Thus, the excitation current supplied from the objective lens power supply 15 to the objective lens 5 is changed to cause the focusing plane of the objective lens to move vertically. Simultaneously with such operation, the specimen is scanned with an electron beam to obtain a scanning image of the specimen. The operator continues to actuate the focus controller 14 until the observed specimen image becomes most sharply defined, whereupon the specimen surface coincides with the focusing plane. At this time, the control unit 16 stores, say, the address "$N_o$" (corresponding to the focusing distance ($D_o$)) read out and the data is delivered to the D/A converter 20.

When it is desired to move the specimen stage 1 vertically from the initial position, the operator actuates the Z axis controller 12 for a desired amount of movement of the specimen stage. At this time, the control unit 16 detects the output signal change of the A/D converter 13 as a change ($\Delta D$) of the specimen position. And the control unit 16 reads out the memory content at address "$N_1$" corresponding to the focusing distance ($D_o + \Delta D$), and delivers the data to the D/A converter 20. Therefore, the objective lens 5 is now energized by an excitation current corresponding to the data at the shifted address in the memory means. Thus, the electron beam remains focused on the specimen surface after the specimen stage has been moved vertically.

According to the present invention as described above, once an electron beam is focused on a specimen even with protrusions and dents, it is not necessary to focus the electron beam again when the stage is later moved vertically, a feature which is extremely advantageous.

Having thus described the invention with the detail and particularity required by the Patent Laws, what is desired protected by Letters Patent is set forth in the following claims.

I claim:

1. A method for controlling the excitation current of the objective lens in a scanning electron microscope or the like comprising:
   (a) a step for storing data which specify the relation between the excitation current (I) of the object lens and the focusing distance (D) of the objective lens;
   (b) a step for focusing the beam upon the specimen by varying the objective lens excitation current while observing the specimen image; and memorizing the initial focusing distance ($D_o$) corresponding to the objective lens excitation current determined by focusing;
   (c) a step for detecting the change in the focusing distance ($\Delta D$) due to the specimen shift relative to the initial focusing distance ($D_o$) along the optical axis of the objective lens after the said focusing operation;
   (d) a step for reading out the excitation current corresponding to the focusing distance ($D_o + \Delta D$) from the data stored in step (a); and
   (e) a step for supplying the objective lens with the excitation current read out in step (d).

2. A scanning electron microscope or the like comprising an objective lens focusing an electron beam on a specimen surface, and a specimen stage for shifting the specimen along the optical axis of the objective lens, being characterized by:
   (a) a memory means for storing data which specify the relation between the excitation current (I) of the objective lens and the focusing distance (D) of the objective lens;
   (b) means for initially focusing the electron beam over the specimen by varying the excitation current to the object lens;
   (c) a memory for storing the initial focusing distance ($D_o$) corresponding to the excitation current applied to the objective lens;
   (d) a signal generating means for generating a signal corresponding to the change in the focusing distance ($\Delta D$) caused by the specimen stage shift relative to the initial focusing distance ($D_o$) along the optical axis of the objective lens; and
   (e) a control means for supplying the objective lens with the excitation current corresponding to the focusing distance ($D_o + \Delta D$) by reading out the data stored in the said memory means.

* * * * *